US012396380B1

(12) United States Patent
Hsu et al.

(10) Patent No.: US 12,396,380 B1
(45) Date of Patent: Aug. 19, 2025

(54) RESISTIVE RANDOM ACCESS MEMORY STRUCTURE AND FABRICATING METHOD OF THE SAME

(71) Applicant: UNITED MICROELECTRONICS CORP., Hsin-Chu (TW)

(72) Inventors: Po-Kai Hsu, Tainan (TW); Chung-Yi Chiu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 396 days.

(21) Appl. No.: 18/134,048

(22) Filed: Apr. 13, 2023

Related U.S. Application Data

(63) Continuation-in-part of application No. 17/541,226, filed on Dec. 2, 2021, now Pat. No. 11,665,913.

(30) Foreign Application Priority Data

Nov. 2, 2021 (CN) .......................... 202111287182.1

(51) Int. Cl.
*H10N 70/00* (2023.01)
*H10B 63/00* (2023.01)
(52) U.S. Cl.
CPC ......... *H10N 70/8833* (2023.02); *H10B 63/30* (2023.02); *H10N 70/063* (2023.02); *H10N 70/066* (2023.02); *H10N 70/841* (2023.02)

(58) Field of Classification Search
CPC .............................. H10B 63/00; H10N 70/00
See application file for complete search history.

(56) References Cited

U.S. PATENT DOCUMENTS

| 2012/0146223 A1 | 6/2012 | Zhao |
| 2014/0104928 A1 | 4/2014 | Sutardja |
| 2014/0322885 A1 | 10/2014 | Xie |
| 2016/0365512 A1 | 12/2016 | Sung |

FOREIGN PATENT DOCUMENTS

| CN | 103730571 A | 4/2014 |
| WO | 2018/004588 A1 | 1/2018 |

*Primary Examiner* — Marvin Payen
(74) *Attorney, Agent, or Firm* — Winston Hsu

(57) ABSTRACT

An RRAM structure includes a substrate. A transistor is disposed on the substrate, wherein the transistor includes a gate structure, a source and a drain. An interlayer dielectric layer covers the transistor. A drain contact plug is disposed within the interlayer dielectric layer and contacts the drain, and wherein an end of the drain contact plug protrudes from the interlayer dielectric layer. A metal interlayer dielectric layer is disposed on and contacts the interlayer dielectric layer. A resistive random access memory (RRAM) is disposed on the drain and within a first trench in the metal interlayer dielectric layer, wherein the RRAM includes a bottom electrode, a metal oxide layer and a top electrode, the drain contact plug contacts the bottom electrode, the bottom electrode contacts the metal oxide layer and the top electrode contacts the metal oxide layer. A metal layer is disposed within the first trench.

12 Claims, 10 Drawing Sheets

RESISTIVE RANDOM ACCESS MEMORY STRUCTURE AND FABRICATING METHOD OF THE SAME

CROSS REFERENCE TO RELATED APPLICATIONS

This application is a continuation-in-part of U.S. application Ser. No. 17/541,226, filed on Dec. 2, 2021. The content of the application is incorporated herein by reference.

BACKGROUND OF THE INVENTION

1. Field of the Invention

The present invention relates to a variable resistance memory (RRAM) structure and a fabricating method of the same, and more particularly to a structure where the RRAM structure is arranged in the first metal layer (metal one level) of the local interconnection in the back end of line.

2. Description of the Prior Art

RRAM is a type of non-volatile memory that has the advantages of small memory cell size, ultra-high-speed operation, low-power operation, high endurance, and compatibility with CMOS.

The main operating principle of RRAM is to change the resistance of the metal oxide by applying bias voltage so as to store data. The data stored in RRAM is read by detecting different resistances in each of RRAMs.

Traditionally, RRAM is inserted in the position of the via, one of the local interconnection in the back-end process. However, by doing so, the top surface of the via one which has RRAM inserted therein becomes uneven, and shifts from the original design position. Therefore, it is necessary to use an additional planarization process to smooth the top surface of RRAM to keep the top surface of the via at the original design position.

SUMMARY OF THE INVENTION

In light of the above, the present invention provides a new method of manufacturing an RRAM structure, which prevents the RRAM from affecting the original horizontal position of the local interconnection without using any additional planarization process.

According to a preferred embodiment of the present invention, a resistive random access memory structure includes a substrate. A transistor is disposed on the substrate, wherein the transistor includes a gate structure, a source and a drain. An interlayer dielectric layer covers the transistor. A drain contact plug is disposed within the interlayer dielectric layer and contacts the drain, and wherein an end of the drain contact plug protrudes from the interlayer dielectric layer. A metal interlayer dielectric layer is disposed on and contacts the interlayer dielectric layer. A resistive random access memory (RRAM) is disposed on the drain and within a first trench in the metal interlayer dielectric layer, wherein the RRAM includes a bottom electrode, a metal oxide layer and a top electrode, the drain contact plug contacts the bottom electrode, the bottom electrode contacts the metal oxide layer and the top electrode contacts the metal oxide layer. A metal layer is disposed within the first trench.

According to another preferred embodiment of the present invention, a fabricating method of a resistive random access memory structure includes providing a substrate, wherein a first transistor is disposed on the substrate, the first transistor includes a first gate structure, a first source and a first drain, a first drain contact plug contacts the first drain, and an interlayer dielectric layer covers and contacts the substrate and the first transistor. A metal interlayer dielectric layer is formed to cover and contact the interlayer dielectric layer. Next, a first patterning process is performed to etch the metal interlayer dielectric layer and the interlayer dielectric layer to form a first trench, and wherein the first drain contact plug is exposed through the first trench, and an end of the first drain contact plug protrudes from the interlayer dielectric layer. Then, a bottom electrode material layer, a metal oxide material layer and a top electrode material layer is formed in sequence to fill in the first trench and cover the metal interlayer dielectric layer. Later, a second patterning process is performed to pattern the bottom electrode material layer, the metal oxide material layer and the top electrode material layer to form a bottom electrode, a metal oxide layer and a top electrode, wherein the top electrode, the metal oxide layer and the bottom electrode form a resistive random access memory (RRAM), and the bottom electrode contacts the first drain contact plug. Subsequently, a metal layer is formed to fill in the first trench and cover the metal interlayer dielectric layer and the RRAM. Finally, a planarization process is performed to remove the bottom electrode outside of the first trench, the metal oxide layer outside of the first trench, the top electrode outside of the first trench and the metal layer outside of the first trench.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 9 depict a fabricating method of a resistive random access memory structure according to a preferred embodiment of the present invention, wherein:

FIG. 1 depicts a substrate with two transistors thereon;
FIG. 2 continues from FIG. 1;
FIG. 3 continues from FIG. 2;
FIG. 4 continues from FIG. 3;
FIG. 5 depicts a top view of FIG. 4;
FIG. 6 continues from FIG. 4;
FIG. 7 depicts a top view of FIG. 6;
FIG. 8 continues from FIG. 6;
FIG. 9 continues from FIG. 8.

DETAILED DESCRIPTION

Figure 2:
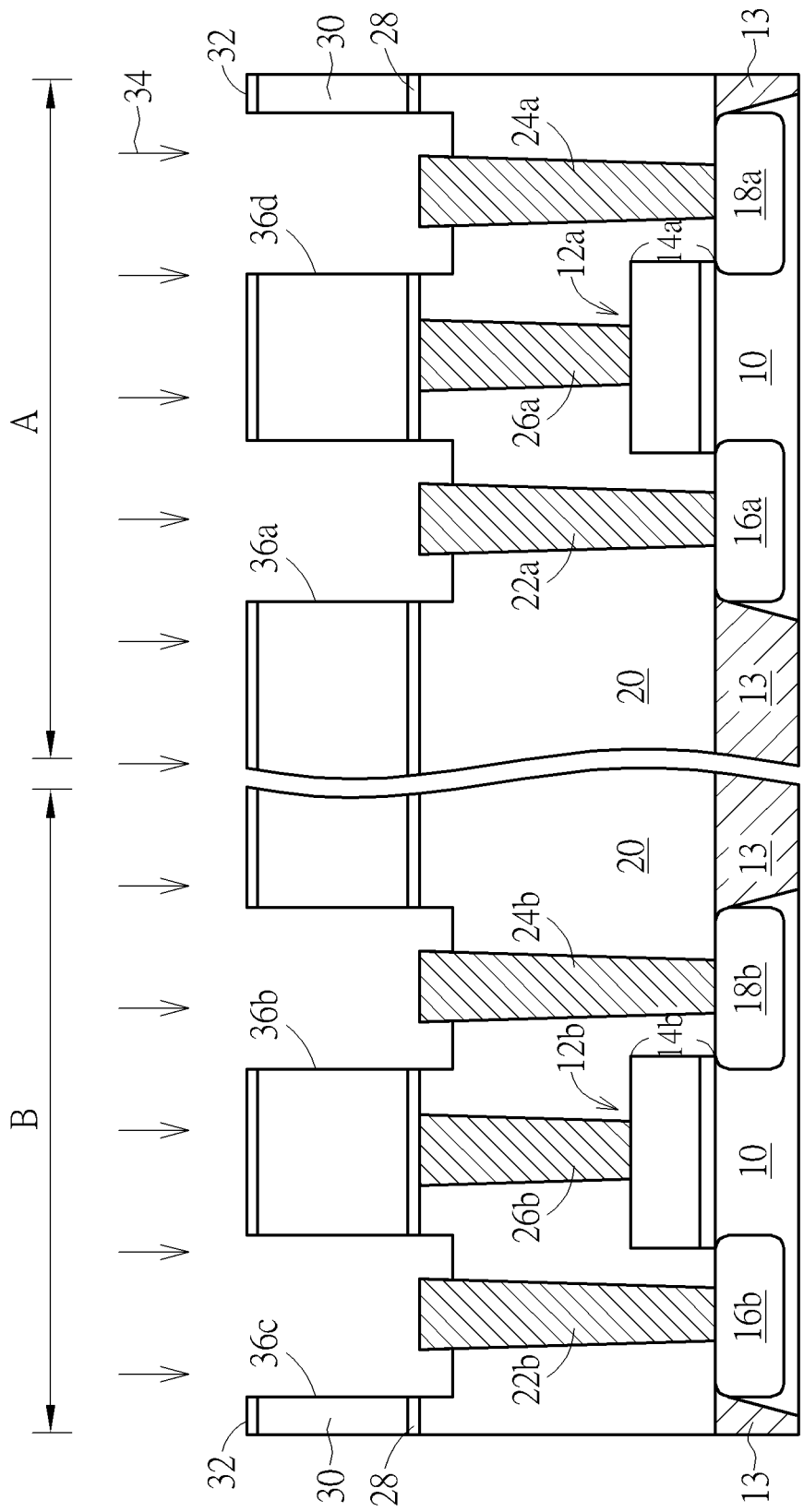
Figure 3:
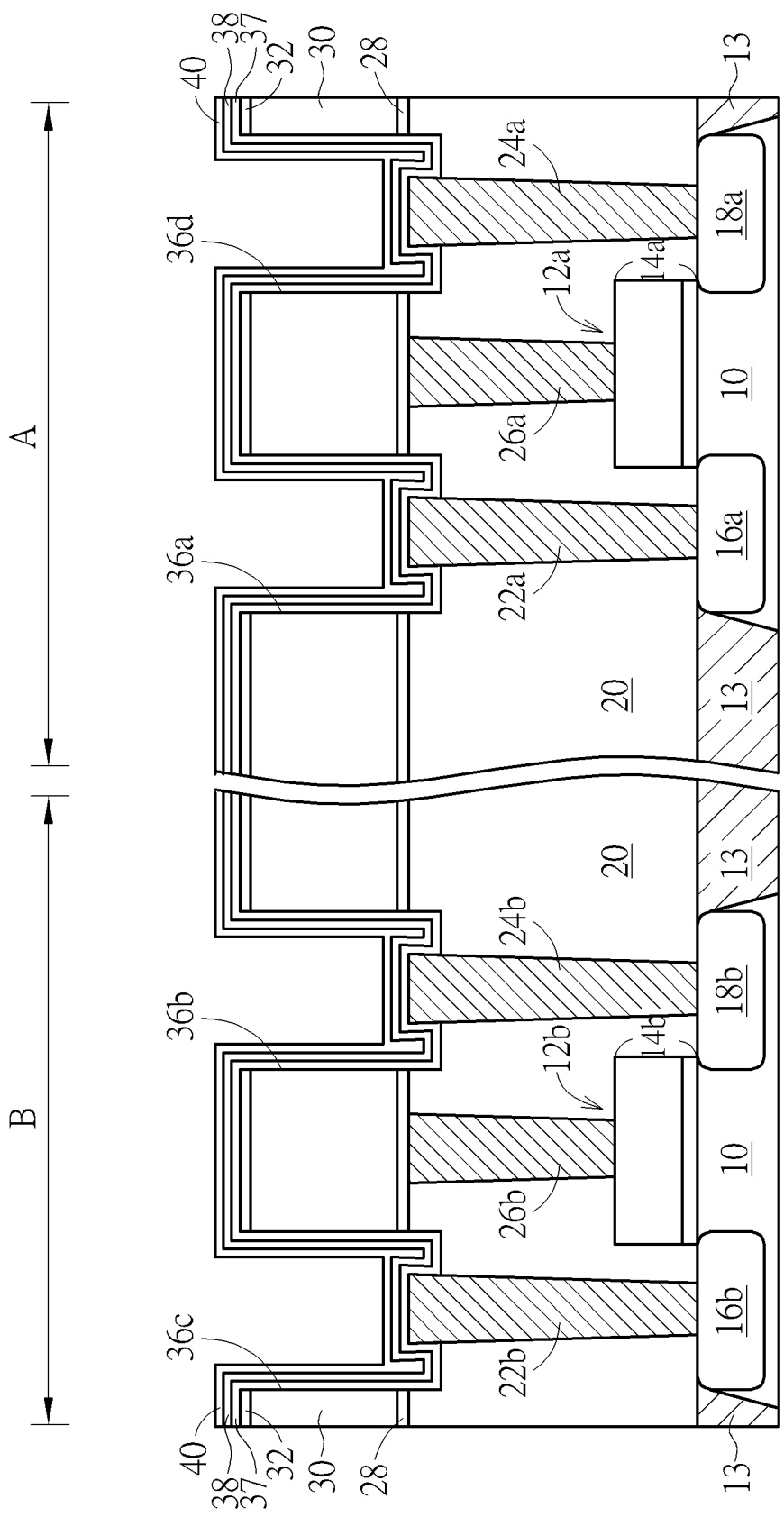
Figure 4:
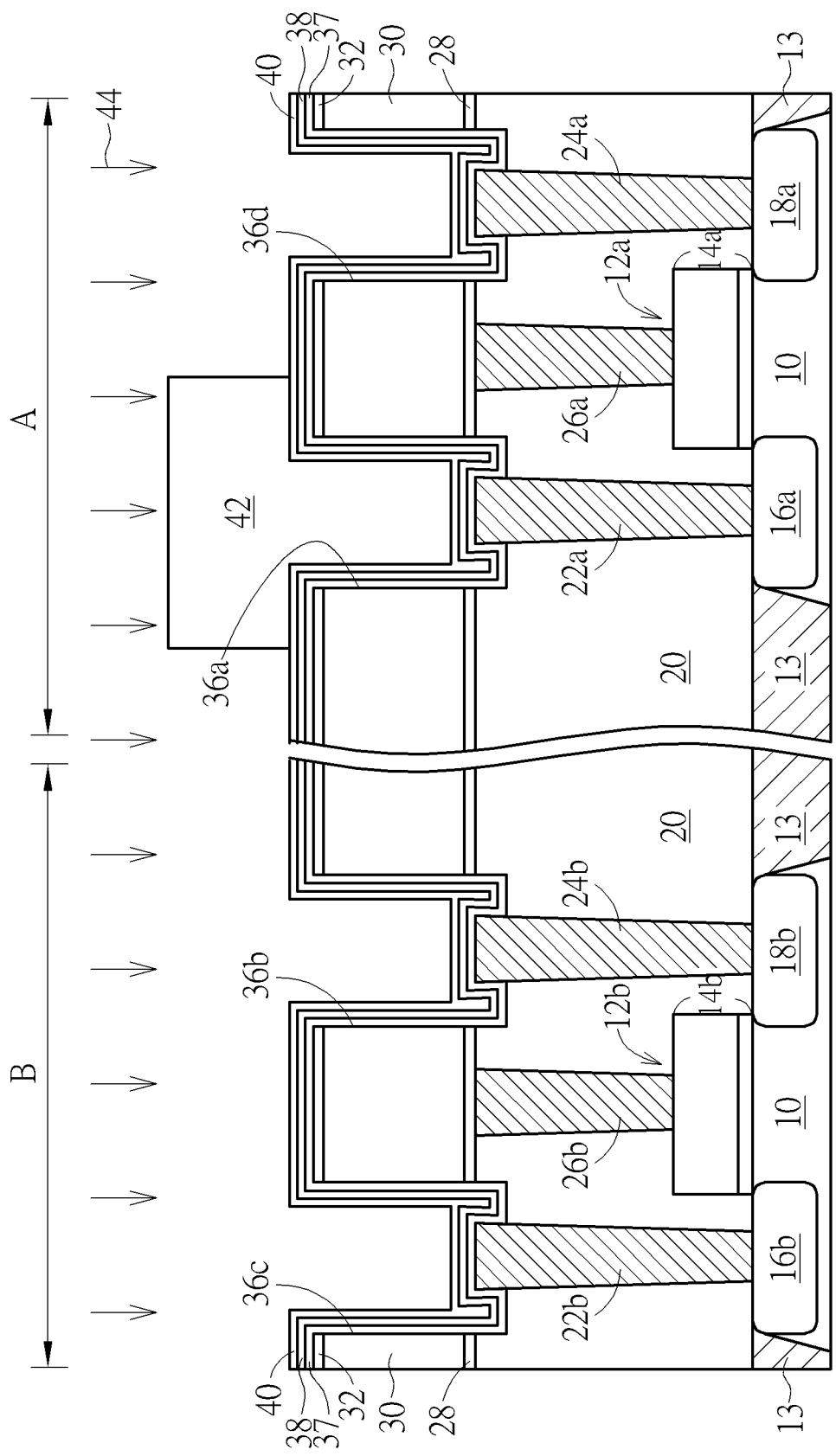
Figure 5:
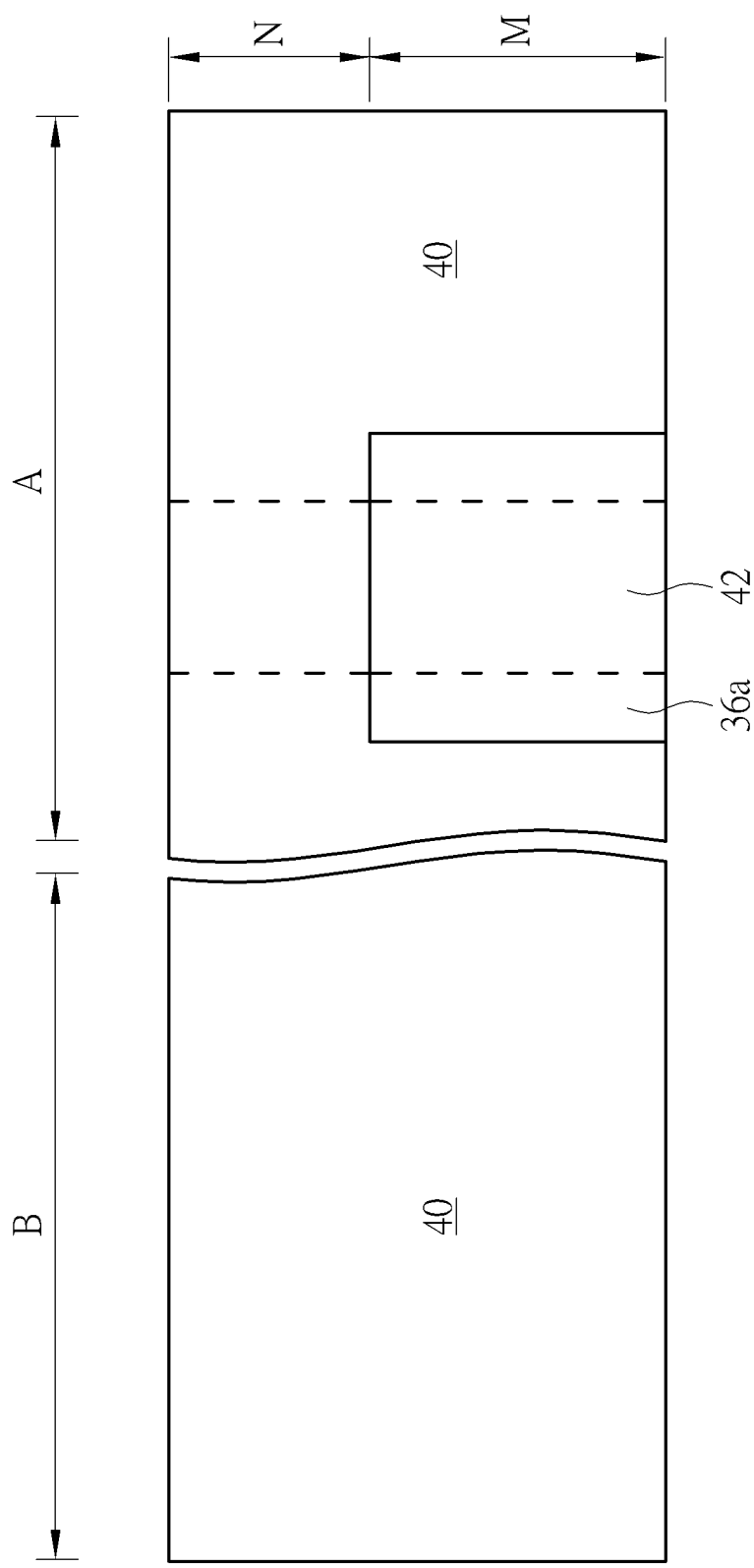
Figure 6:
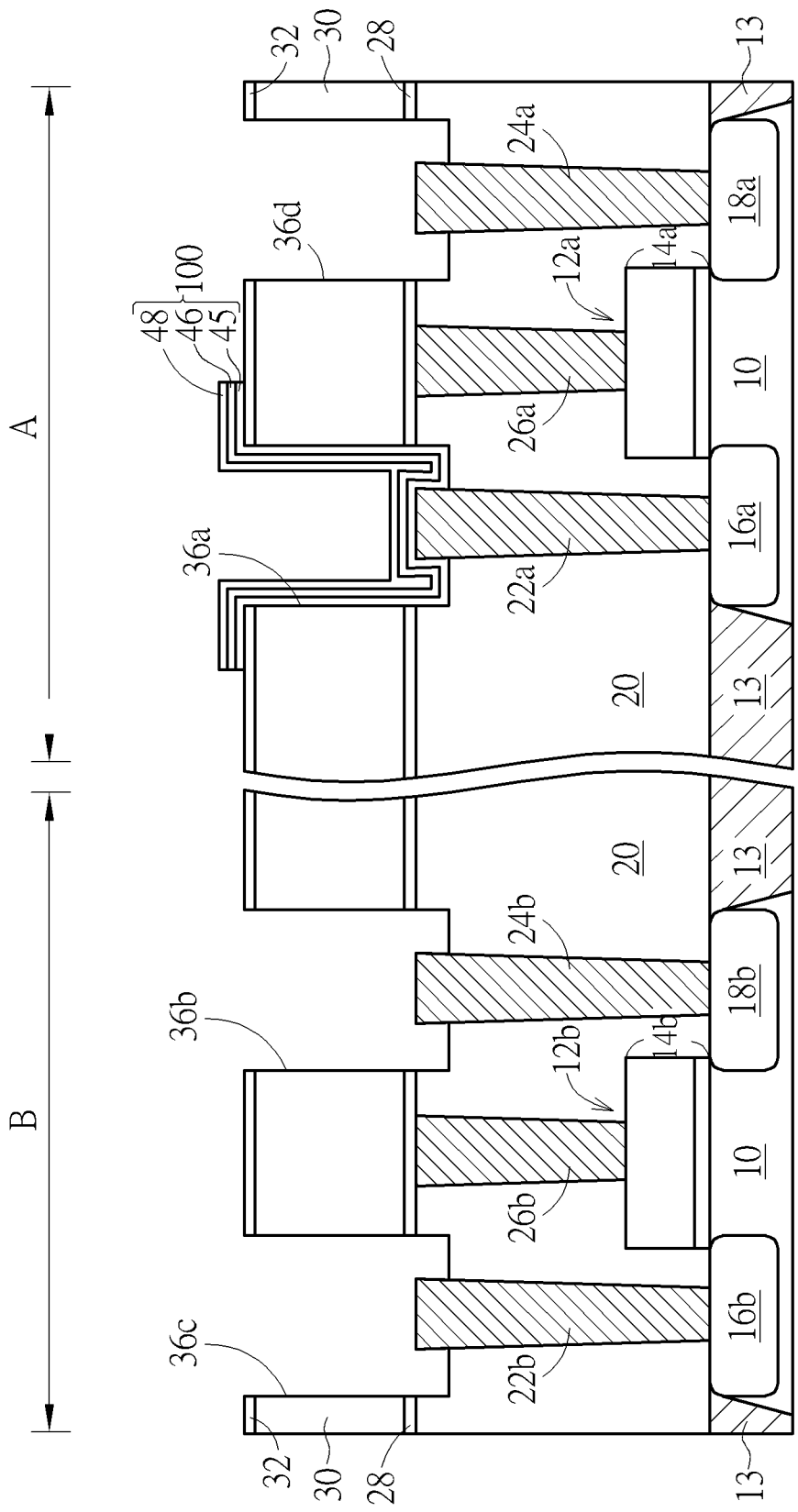
Figure 7:
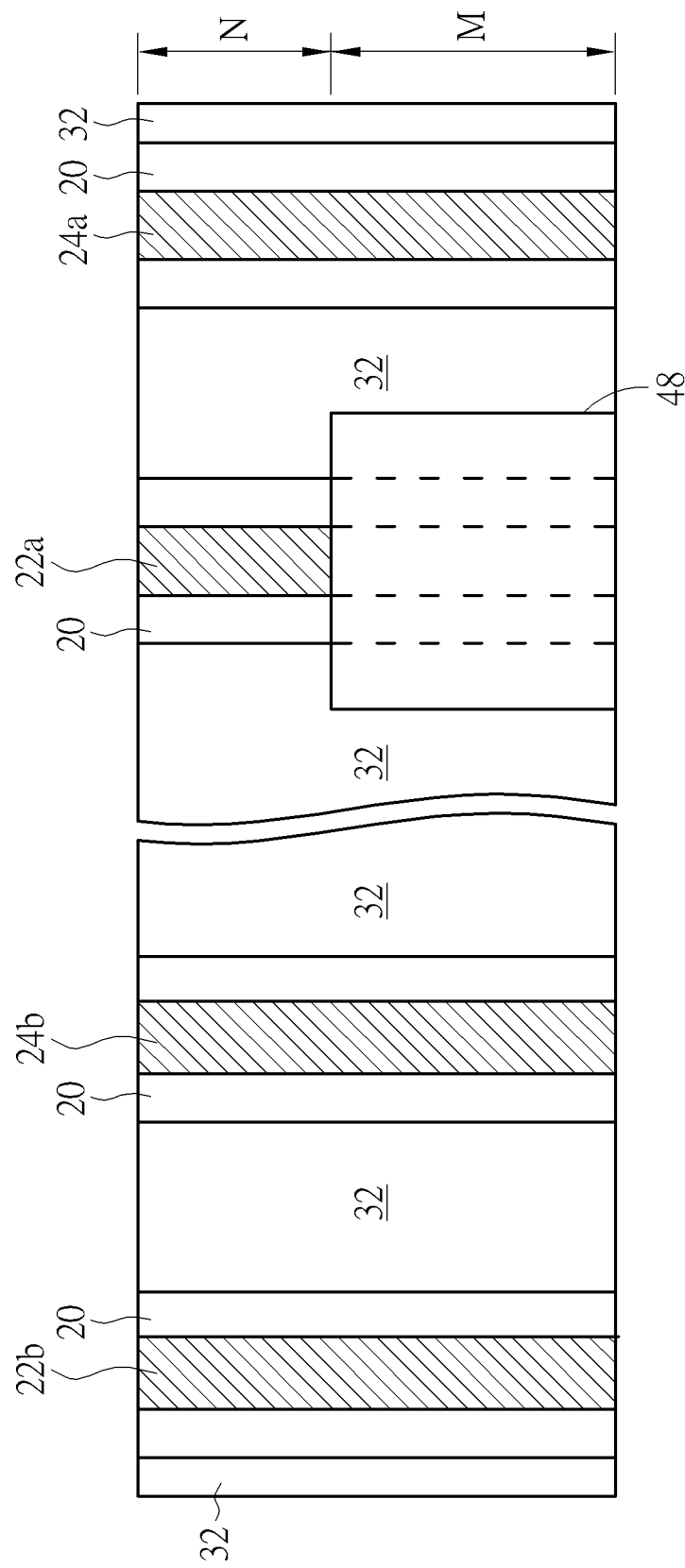

FIG. 1 to FIG. 9 depict a fabricating method of a resistive random access memory structure according to a preferred embodiment of the present invention, wherein FIG. 5 depicts a top view of FIG. 4, and FIG. 7 depicts a top view of FIG. 6.

Figure 1:
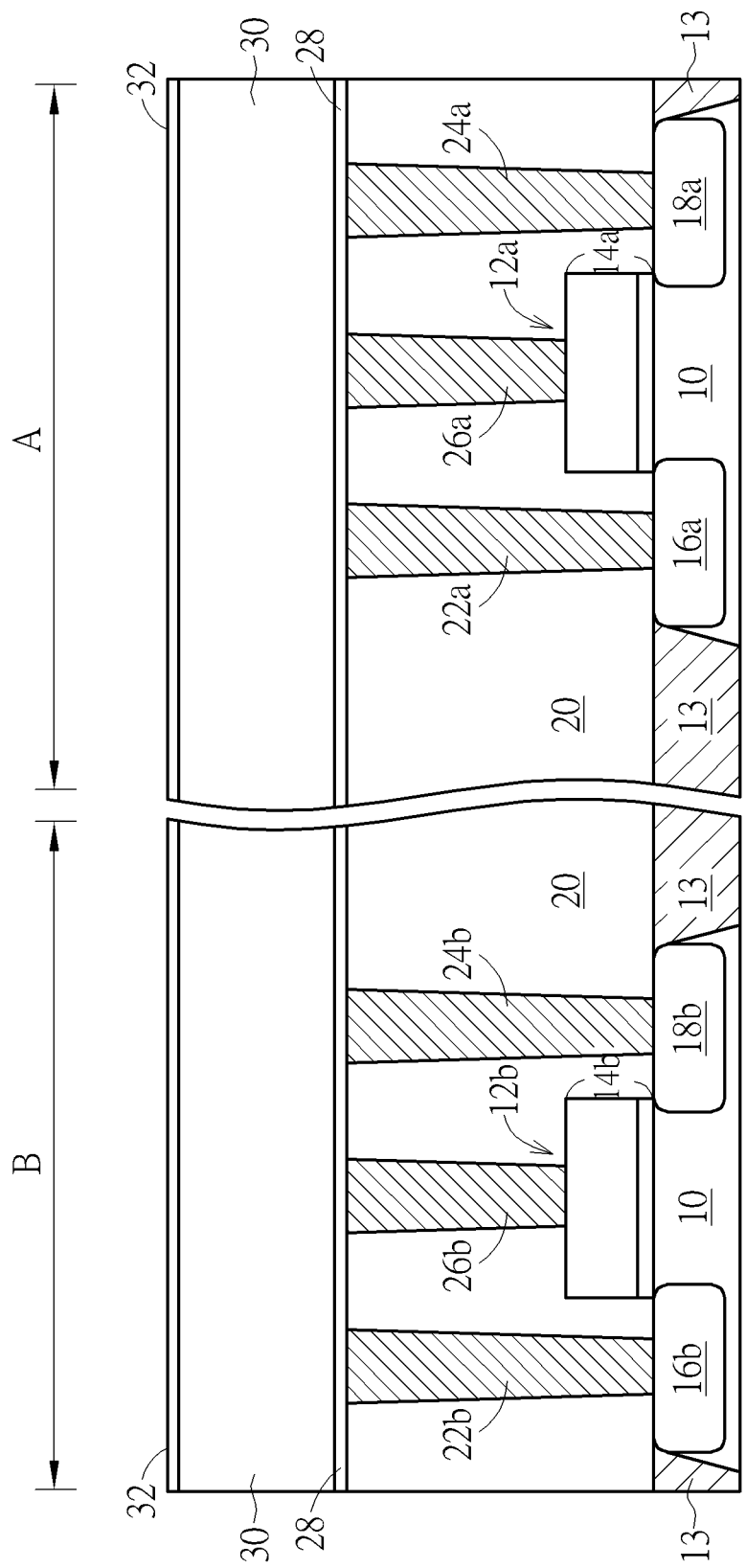

As shown in FIG. 1, a substrate 10 is provided. The substrate 10 is divided into a memory cell region A and a logic element region B. A first transistor 12a and a second transistor 12b are disposed on the substrate 10. The first transistor 12a is disposed within the memory cell region A, and the second transistor 12b is disposed within the logic element region B. The first transistor 12a includes a first gate structure 14a, a first source 18a and a first drain 16a. The second transistor 12b includes a second gate structure 14b, a second drain 18b and a second drain 16b. An interlayer dielectric layer 20 covers and contacts the substrate 10, the first transistor 12a and the second transistor 12b. A first drain contact plug 22a, a first source contact plug 24a, a second drain contact plug 22b and a source contact plug 24b penetrate the interlayer dielectric layer 20. Moreover, the first drain contact plug 22a contacts the first drain 16a. The first source contact plug 24a contacts the first source 18a. The second drain contact plug 22b contacts the second drain 16b. The second source contact plug 24b contacts the second source 18b. A first gate contact plug 26a penetrates the interlayer dielectric layer 20 to contact the first gate structure 14a. A second gate contact plug 26b penetrates the interlayer dielectric layer 20 to contact the second gate structure 14b. Next, an etching stop layer 28, a metal interlayer dielectric layer 30 and a hard mask 32 are formed in sequence to cover the interlayer dielectric layer 20. The etching stop layer 28 preferably includes silicon oxynitride, silicon carbide nitride or silicon nitride. The metal interlayer dielectric layer 30 can be oxide such as silicon oxide. The hard mask 32 can be titanium nitride or silicon nitride.

As shown in FIG. 2, the hard mask 32 is patterned. Next, a first patterning process is performed by taking the hard mask 32 after patterning as a mask to etch the metal interlayer dielectric layer 30, the etching stop layer 28 and the interlayer dielectric layer 20 to form a first trench 36a, a second trench 36b, a third trench 36c and a fourth trench 36d. The first drain contact plug 22a is exposed through the first trench 36a, an end of the first drain contact plug 22a protrudes from the interlayer dielectric layer 20 and part of the first drain contact plug 22a is still embedded in the interlayer dielectric layer 20. The first source contact plug 24a is exposed through the fourth trench 36d, an end of the first source contact plug 24a protrudes from the interlayer dielectric layer 20 and part of the first source contact plug 24a is still embedded in the interlayer dielectric layer 20. The second source contact plug 24b is exposed through the second trench 36b, an end of the second source contact plug 24b protrudes from the interlayer dielectric layer 20 and part of second source contact plug 24b is still embedded in the interlayer dielectric layer 20. The second drain contact plug 22b is exposed through the third trench 36c, an end of the second drain contact plug 22b protrudes from the interlayer dielectric layer 20 and part of second drain contact plug 22b is still embedded in the interlayer dielectric layer 20. The first drain contact plug 22a, the first source contact plug 24a, the second drain contact plug 22b and the second source contact plug 24b are preferably tungsten, copper or other metals. In this embodiment, the first drain contact plug 22a, the first source contact plug 24a, the second drain contact plug 22b and the second source contact plug 24b are tungsten.

As shown in FIG. 3, a bottom electrode material layer 37, a metal oxide material layer 38 and a top electrode material layer 40 are formed in sequence to conformally fill into the first trench 36a, the second trench 36b, the third trench 36c and the fourth trench 36d, and to cover the metal interlayer dielectric layer 30. The bottom electrode material layer 37 respectively encapsulates the protruded end of the first drain contact plug 22a, the protruded end of the first source contact plug 24a, the protruded end of the second drain contact plug 22b and the protruded end of the second source contact plug 24b. The bottom electrode material layer 37 includes titanium nitride or tantalum nitride. The metal oxide material layer 38 includes tantalum oxide, hafnium oxide or titanium oxide. The top electrode material layer 40 includes titanium nitride or tantalum nitride. In this embodiment, the metal oxide material layer 38 is tantalum oxide. The top electrode material layer 40 is tantalum nitride. The metal oxide material layer 38 and the top electrode material layer 40 can be made by sputtering.

Please refer to FIG. 4 and FIG. 5. A photoresist 42 is formed to cover a memory cell predetermined region M within the first trench 36a, expose a metal connection region N within the first trench 36a and expose the entire logic element region B. Please refer to FIG. 4, FIG. 6 and FIG. 7, a second patterning process 44 is performed to pattern the bottom electrode material layer 37, the metal oxide material layer 38 and the top electrode material layer 40 by taking the photoresist 42 as a mask to form a bottom electrode 45, a metal oxide layer 46 and a top electrode 48. Furthermore, during the second patterning process 44, the bottom electrode material layer 37, the metal oxide material layer 38 and the top electrode material layer 40 within the second trench 36b, the third trench 36c and within the fourth trench 36d are removed entirely. Therefore, the ends of the first source contact plug 24a, the second drain contact plug 22b and the second source contact plug 24b are protruded from the interlayer dielectric layer 20 again. The bottom electrode 45, the metal oxide layer 46 and the top electrode 48 are located within the memory cell predetermined region M. Now, the bottom electrode 45, the top electrode 48 and the metal oxide layer 46 form a resistive random access memory (RRAM) 100. The first drain contact plug 22a contacts the bottom electrode 45. The second patterning process 44 is preferably an etching process. During the etching process of the second patterning process 44, the hard mask 32 serves as a stop layer. After the second patterning process 44, the photoresist 42 is removed. While removing the photoresist 42, the top electrode 48 can protect the metal oxide layer 46 from being damaged by cleaning solution used for removing the photoresist 42.

Figure 8:
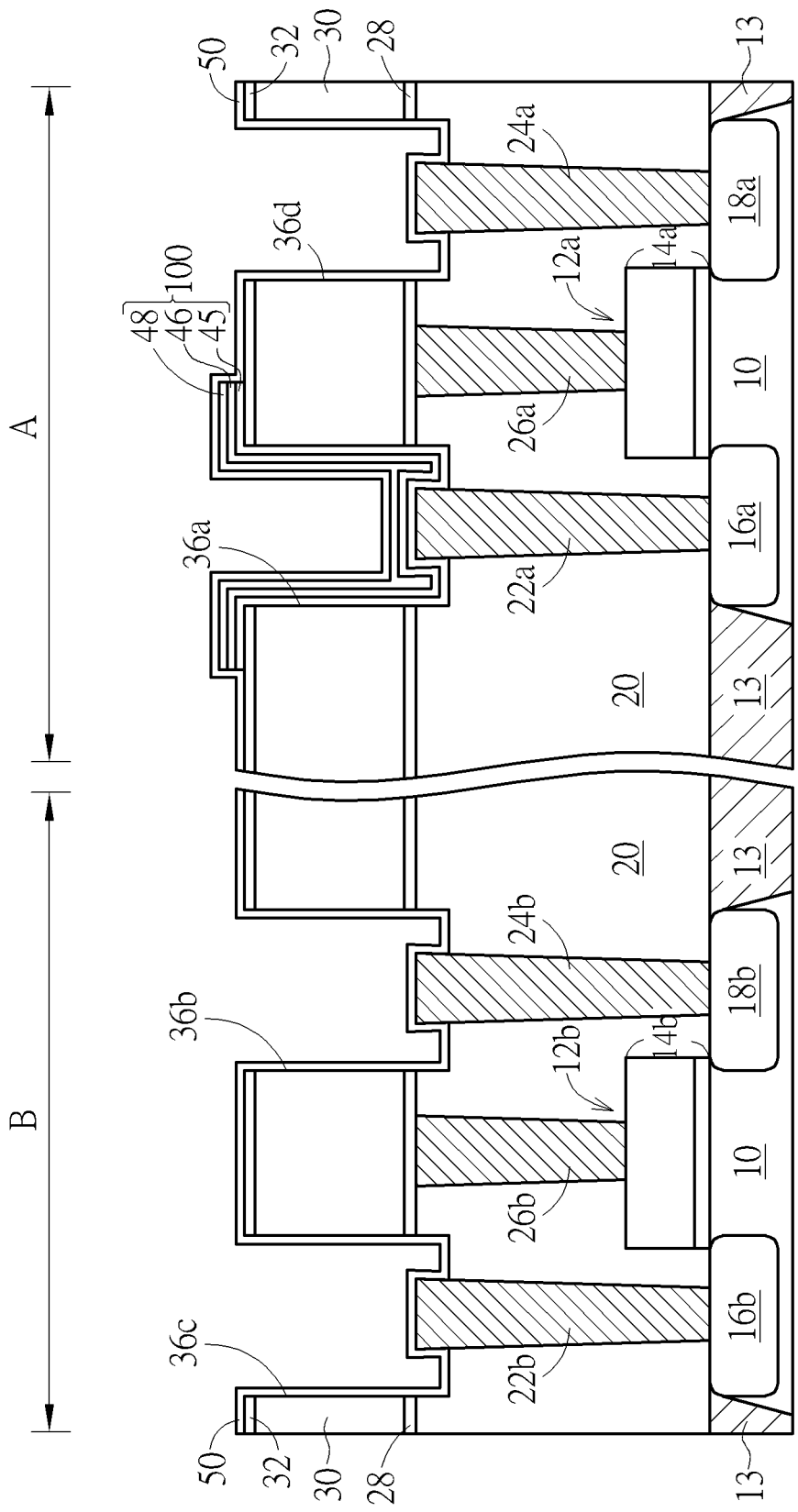
Figure 9:
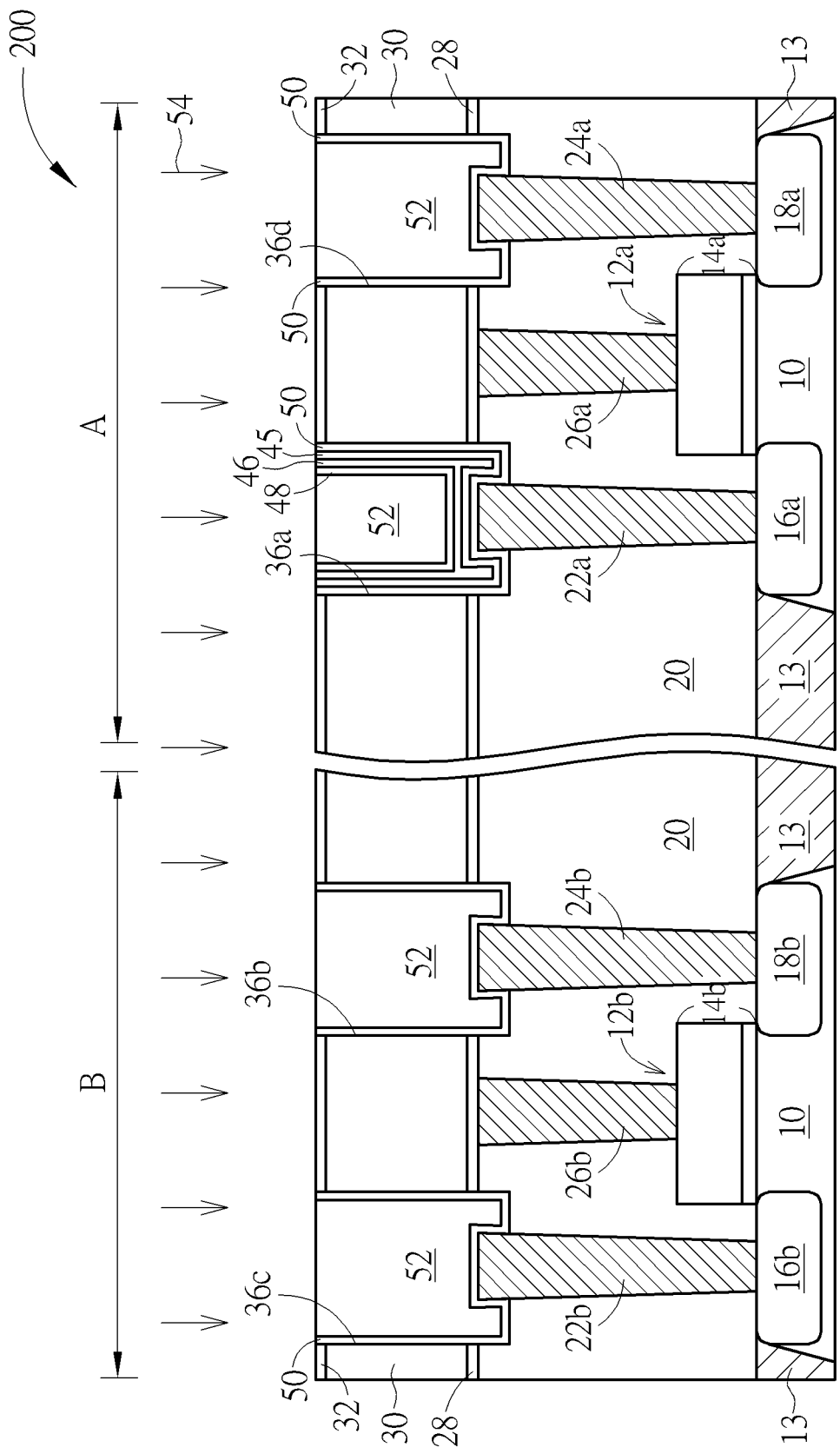

As shown in FIG. 8, a buffer layer 50 and a metal layer 52 are formed in sequence to fill in the first trench 36a, the second trench 36b, the third trench 36c and the fourth trench 36d, and cover the interlayer dielectric layer 20 and the RRAM 100. The buffer layer 50 encapsulates the end of the first source contact plug 24a, the end of the second drain contact plug 22b and the end of the second source contact plug 24b. As shown in FIG. 9, a planarization process 54 is performed to remove the hard mask 32, the bottom electrode 45, the metal oxide layer 46, the top electrode 48, the buffer layer 50 and the metal layer 52 outside of the first trench 36a, and to remove the hard mask 32, the buffer layer 50 and the metal layer 52 outside of the second trench 36b, the third trench 36c and the fourth trench 36d. Now, the metal layer 52 within the first trench 36a serves as a bit line of the first transistor 12a. The metal layer 52 within the fourth trench 36d serves as a source line of the first transistor 12a. The metal layer 52 within the second trench 36b serves as a source line of the second transistor 12b. The metal layer 52 within the third trench 36c serves as a drain line of the second transistor 12b. Now, an RRAM structure 200 of the present invention is completed.

Figure 10:
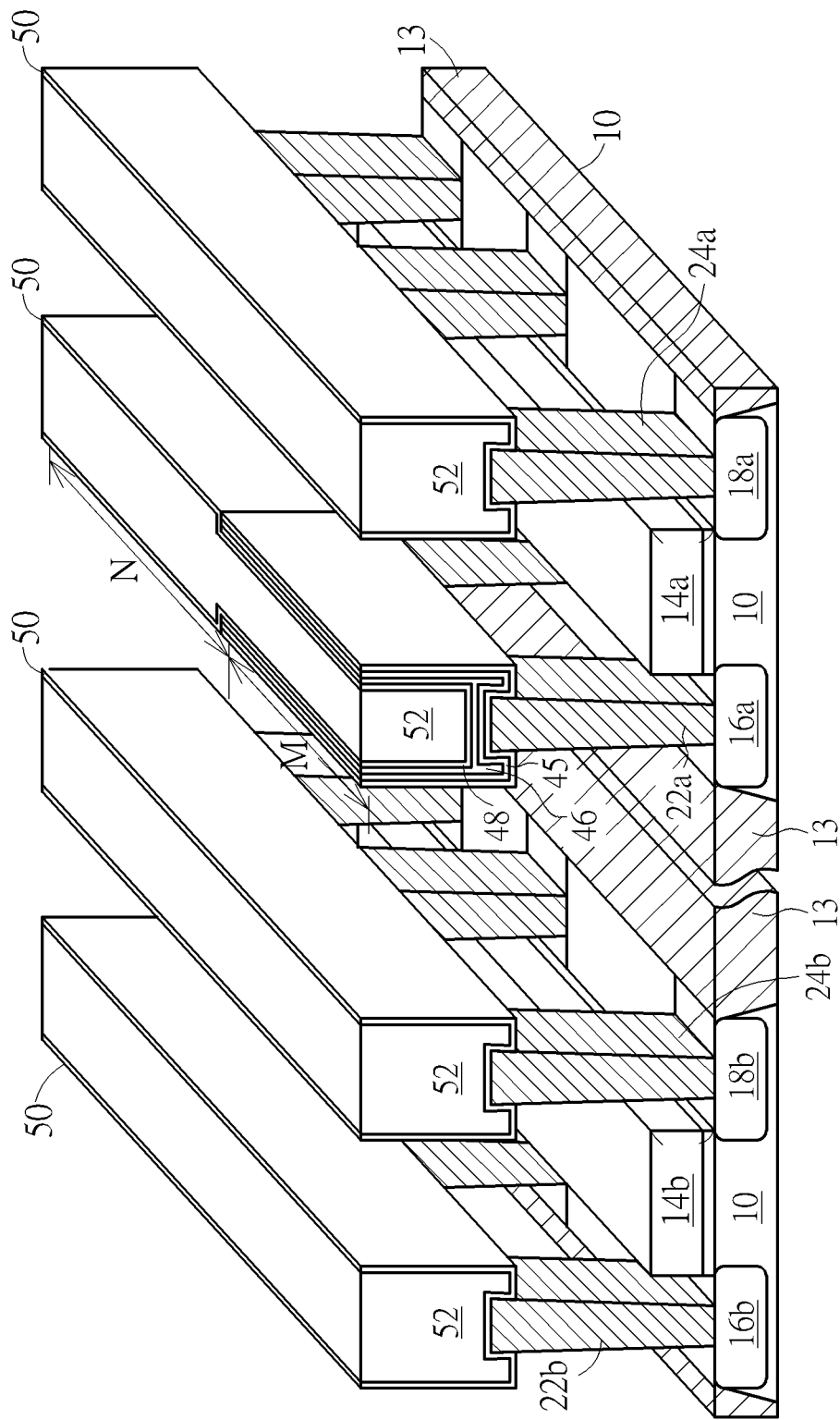
FIG. 10 shows a three-dimensional view of the RRAM structure in FIG. 9.

FIG. 9 depicts a RRAM structure according to a preferred embodiment of the present invention. FIG. 10 shows a three-dimensional view of the RRAM structure in FIG. 9. In order to show the RRAM structure clearly, the inlayer dielectric layer, the metal interlayer dielectric layer and all gate contact plugs are omitted in FIG. 10.

Please refer to FIG. 9 and FIG. 10. An RRAM structure 200 includes a substrate 10. The substrate 10 is divided into a memory cell region A and a logic element region B. A first transistor 12a and a second transistor 12b are disposed on the substrate 10. The first transistor 12a is disposed within the memory cell region A, and the second transistor 12b is disposed within the logic element region B. Numerous shallow trench isolations 13 are disposed within the substrate 10 and at two sides of the first transistor 12a and the second transistor 12b. The first transistor 12a includes a first gate structure 14a, a first source 18a and a first drain 16a. The second transistor 12b includes a second gate structure 14b, a second drain 18b and a second drain 16b. An interlayer dielectric layer 20 covers and contacts the substrate 10, the first transistor 12a and the second transistor 12b. A first drain contact plug 22a, a first source contact plug 24a, a second drain contact plug 22b and a source contact plug 24b penetrate the interlayer dielectric layer 20. An end of the first drain contact plug 22a protrudes from the interlayer dielectric layer 20. An end of the first source contact plug 24a protrudes from the interlayer dielectric layer 20. An end of the second source contact plug 24b protrudes from the interlayer dielectric layer 20. An end of the second drain contact plug 22b protrudes from the interlayer dielectric layer 20. Moreover, the first drain contact plug 22a contacts the first drain 16a. The first source contact plug 24a contacts the first source 18a. The second drain contact plug 22b contacts the second drain 16b. The second source contact plug 24b contacts the second source 18b. The first gate contact plug 26a penetrates the interlayer dielectric layer 20 to contact the first gate structure 14a. The second gate contact plug 26b penetrates the interlayer dielectric layer 20 to contact the second gate structure 14b.

A metal interlayer dielectric layer 30 is disposed on the first drain contact plug 22a and covers the interlayer dielectric layer 20. An RRAM 100 is disposed on the first drain 16a and within a first trench 36a within the metal interlayer dielectric layer 30. The RRAM 100 includes the bottom electrode 45, the metal oxide layer 46 and the top electrode 48 arranged in sequence. The first drain contact plug 22a contacts the bottom electrode 45 of the RRAM 100. The metal oxide layer 46 contacts the bottom electrode 45 and the top electrode 48 contacts the metal oxide layer 46. The bottom electrode 45 encapsulates the end of the first drain contact plug 22a. The protruding end of the first drain contact plug 22a provides more contact area between the first drain contact plug 22a and the bottom electrode 45. Because higher electric field is generated around the protruding end of the first drain contact plug 22a, the efficiency of the RRAM 100 can be increased. Furthermore, a buffer layer 50 and a metal layer 52 are disposed within the first trench 36a. The buffer layer 50 is disposed between the metal layer 52 and top electrode 48. The metal layer 52 and the buffer layer 50 are disposed within a fourth trench 36d within the metal interlayer dielectric layer 30. The buffer layer 50 within the fourth trench 36d contacts the first source contact plug 24a. The metal layer 52 within the first trench 36a serves as a bit line of the first transistor 12a. The metal layer 52 within the fourth trench 36d serves as a source line of the first transistor 12a.

Moreover, the first trench 36a is divided into a memory cell predetermined region M and a metal connection region N. The RRAM 100 is disposed within the memory cell predetermined region M. In other words, the bottom electrode 45, the metal oxide layer 46 and the top electrode 48 are within the memory cell predetermined region M. However, the metal oxide layer 46 and the top electrode 48 are not within the metal connection region N, and the metal layer 52 and the buffer layer 50 are within the metal connection region N.

Moreover, a second trench 36b and a third trench 36c are disposed within the logic element region B. The metal layer 52 and the buffer layer 50 are also disposed within the second trench 36b and the third trench 36c. A top surface of the metal layer 52 within the first trench 36a, the second trench 36b, the third trench 36c and the fourth trench 36d is aligned with a top surface of the metal interlayer dielectric layer 30. Two end of the bottom electrode 45, two ends of the metal oxide layer 46 and two ends of the top electrode 48 are aligned with the top surface of the metal interlayer dielectric layer 30. According to a preferred embodiment of the present invention, the first drain contact plug 22a, the first source contact plug 24a, the second drain contact plug 22b and the second source contact plug 24b are preferably tungsten. The bottom electrode 45 is tantalum nitride or titanium nitride. The metal oxide layer 46 is tantalum oxide. The top electrode 48 is tantalum nitride. However, the top electrode 48 can be made of other conductive materials such as hafnium, zirconium, aluminum, tantalum, titanium, chromium, tungsten, copper, cobalt, palladium or platinum. The metal oxide layer 46 can be hafnium oxide, aluminum oxide, lanthanum oxide, yttrium oxide or zirconium oxide.

The RRAM of the present invention is arranged at the position of the first metal layer (metal one level) in the local interconnection of the back-end process. In details, the first metal layer directly contacts the source contact plug and the drain contact plug. Therefore, the fabricating process of the RRAM can be combined with the first metal layer process. The first metal layer process refers to a process of forming the metal layer in the second trench, the third trench and the fourth trench as described above. Combining with the first metal layer process, the bottom electrode, the metal oxide layer and the top electrode of the RRAM, and the metal layer in the first trench can be planarized by the planarization process in the first metal layer process. In this way, an additional planarization process is not required.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A resistive random access memory structure, comprising:
   a substrate;
   a transistor disposed on the substrate, wherein the transistor comprises a gate structure, a source and a drain;
   an interlayer dielectric layer covering and contacting the transistor;
   a drain contact plug disposed within the interlayer dielectric layer and contacting the drain,
   and wherein an end of the drain contact plug protrudes from the interlayer dielectric layer;
   a metal interlayer dielectric layer disposed on and contacting the interlayer dielectric layer;
   a resistive random access memory (RRAM) disposed on the drain and within a first trench in the metal interlayer dielectric layer, wherein the RRAM comprises a bottom electrode, a metal oxide layer and a top electrode, the drain contact plug contacts the bottom electrode, the bottom electrode contacts the metal oxide layer and the top electrode contacts the metal oxide layer; and
   a metal layer disposed within the first trench.

2. The resistive random access memory structure of claim 1, wherein a top surface of the metal layer is aligned with a top surface of the metal interlayer dielectric layer.

3. The resistive random access memory structure of claim 1, wherein the first trench is separated into a memory cell predetermined region and a metal connection region, the bottom electrode, the metal oxide layer and the top electrode are disposed within the memory cell predetermined region.

4. The resistive random access memory structure of claim 3, wherein the bottom electrode, the metal oxide layer and the top electrode are not within the metal connection region.

5. The resistive random access memory structure of claim 1, further comprising a second trench disposed within the metal interlayer dielectric layer, a source contact plug contacting the source and being exposed from the second trench, a buffer layer and the metal layer disposed within the second trench, and the buffer layer contacting the source contact plug.

6. The resistive random access memory structure of claim 5, wherein the source contact plug is within the interlayer dielectric layer, and an end of the source contact plug protrudes from the interlayer dielectric layer.

7. The resistive random access memory structure of claim 1, wherein the bottom electrode, the metal oxide layer and the top electrode are not within the second trench.

8. A fabricating method of a resistive random access memory structure, comprising:
   providing a substrate, wherein a first transistor is disposed on the substrate, the first transistor comprises a first gate structure, a first source and a first drain, a first drain contact plug contacts the first drain, and an interlayer dielectric layer covers and contacts the substrate and the first transistor;
   forming a metal interlayer dielectric layer covering and contacting the interlayer dielectric layer;
   performing a first patterning process to etch the metal interlayer dielectric layer and the interlayer dielectric layer to form a first trench, and wherein the first drain contact plug is exposed through the first trench, and an end of the first drain contact plug protrudes from the interlayer dielectric layer;
   forming a bottom electrode material layer, a metal oxide material layer and a top electrode material layer in sequence to fill in the first trench and cover the metal interlayer dielectric layer;
   performing a second patterning process to pattern the bottom electrode material layer, the metal oxide material layer and the top electrode material layer to form a bottom electrode, a metal oxide layer and a top electrode, wherein the top electrode, the metal oxide layer and the bottom electrode form a resistive random access memory (RRAM), and the bottom electrode contacts the first drain contact plug;
   forming a metal layer filling in the first trench and covering the metal interlayer dielectric layer and the RRAM; and
   performing a planarization process to remove the bottom electrode, the metal oxide layer, the top electrode and the metal layer outside of the first trench.

9. The fabricating method of a resistive random access memory structure of claim 8, further comprising:
   providing a second transistor disposed on the substrate, wherein the second transistor comprises a second gate structure, a second source and a second drain, the interlayer dielectric layer covers the second transistor, a second source contact plug and a second drain contact plug are disposed within the interlayer dielectric layer and respectively contact the second source and the second drain.

10. The fabricating method of a resistive random access memory structure of claim 9, further comprising:
   during the first patterning process, etching the metal interlayer dielectric layer and the interlayer dielectric layer to form a second trench and a third trench, wherein the second source contact plug is exposed through the second trench and the second drain contact plug is exposed through the third trench, and an end of the second source contact plug and an end of the second drain contact plug protrude from the interlayer dielectric layer;
   while forming the bottom electrode material layer, the metal oxide material layer and the top electrode material layer to fill in the first trench, the bottom electrode material layer, the metal oxide material layer and the top electrode material layer filling in the second trench and the third trench and the bottom electrode material layer, the metal oxide material layer and the top electrode material layer covering the metal interlayer dielectric layer;
   during the second patterning process, removing the bottom electrode material layer, the metal oxide material layer and the top electrode material layer within the second trench and the third trench;
   after the second patterning process, forming a buffer layer filling in the first trench, the second trench and the third trench;
   while forming the metal layer to fill in the first trench, the metal layer filling in the second trench and the third trench; and
   during the planarization process, removing the bottom electrode layer, the metal oxide layer, the top electrode layer, the buffer layer and the metal layer outside of the first trench, and removing the buffer layer and the metal layer outside of the second trench and the third trench.

11. The fabricating method of a resistive random access memory structure of claim 10, wherein a top surface of the metal layer, a top surface of the buffer layer, a top surface of the bottom electrode, a top surface of the metal oxide layer, a top surface of the top electrode and a top surface of the metal interlayer dielectric layer are aligned.

12. The fabricating method of a resistive random access memory structure of claim 10, wherein the first trench is separated into a memory cell predetermined region and a metal connection region, during the second patterning process, removing the bottom electrode, the metal oxide layer and the top electrode within the metal connection region, and remaining the bottom electrode, the metal oxide layer and the top electrode within the memory cell predetermined region.

* * * * *